(12) United States Patent
Koh et al.

(10) Patent No.: US 7,136,006 B2
(45) Date of Patent: Nov. 14, 2006

(54) SYSTEMS AND METHODS FOR MISMATCH CANCELLATION IN SWITCHED CAPACITOR CIRCUITS

(75) Inventors: Jinseok Koh, Plano, TX (US); Alexander H. Reyes, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/165,771

(22) Filed: Jun. 23, 2005

(65) Prior Publication Data

US 2006/0132341 A1  Jun. 22, 2006

Related U.S. Application Data

(60) Provisional application No. 60/636,501, filed on Dec. 16, 2004.

(51) Int. Cl.
  *H03M 1/12* (2006.01)
(52) U.S. Cl. ...................... 341/172; 341/139
(58) Field of Classification Search ......... 341/139–172
  See application file for complete search history.

(56) References Cited

U.S. PATENT DOCUMENTS

| 5,072,219 A | * | 12/1991 | Boutaud et al. | 341/143 |
| 5,392,043 A | * | 2/1995 | Ribner | 341/143 |
| 5,563,597 A | * | 10/1996 | McCartney | 341/143 |
| 5,703,589 A | * | 12/1997 | Kalthoff et al. | 341/143 |
| 5,818,377 A | * | 10/1998 | Wieser | 341/143 |
| 6,037,887 A | * | 3/2000 | Wu et al. | 341/143 |
| 6,204,787 B1 | * | 3/2001 | Baird | 341/143 |
| 6,323,801 B1 | * | 11/2001 | McCartney et al. | 341/172 |
| 6,509,790 B1 | * | 1/2003 | Yang | 341/172 |
| 6,570,519 B1 | * | 5/2003 | Yang | 341/143 |
| 6,842,128 B1 | | 1/2005 | Koh | |
| 6,900,999 B1 | * | 5/2005 | Yen et al. | 365/49 |
| 6,927,722 B1 | * | 8/2005 | Hong | 341/172 |
| 2005/0275580 A1 | * | 12/2005 | Hong et al. | 341/172 |

OTHER PUBLICATIONS

U.S. Appl. No. 10/877,015, filed Jun. 25, 2004, Koh.
Paul J. Hurst and William J. McIntyre; Double Sampling in Switched-Capacitor Delta-Sigma A/D Converters; 1990 IEEE; pp. 902-905, no month.
Paul J. Hurst and Ken C. Dyer; An Improved Double Sampling Scheme For Switched-Capacitor Delta-Sigma Modulators; 1992 IEEE; pp. 1179-1182, no month.
Bosco H. Leung and Sehat Sutarja; Multi Sigma-Delta A/D Converter Incorporating A Novel Class of Dynamic Element Matching Techniques; 1992 IEEE; pp. 35-51, no month.
Hong-Kui Yang and Ezz I. El-Masry; A Novel Double Sampling Technique for Delta-Sigma Modulators; 1995 IEEE; pp. 1187-1190, no month.

(Continued)

*Primary Examiner*—Lam T. Mai
(74) *Attorney, Agent, or Firm*—Ronald O. Neerings; Wade James Brady, III; Frederick J. Telecky, Jr.

(57) ABSTRACT

Various circuits, systems and methods are disclosed for providing double-sampling sigma-delta modulator circuits. For example, circuits are disclosed that include an amplifier with an integrating capacitor, a switched capacitor conversion element that includes a single capacitor bank, and a control element that provides phase signaling that identifies at least two phases. In operation, charge present on the single capacitor bank is transferred to the integrating capacitor and the single capacitor bank is charged during one phase. During the other phase, charge present on the single capacitor bank is transferred to the integrating capacitor, and the single capacitor bank is discharged.

20 Claims, 5 Drawing Sheets

OTHER PUBLICATIONS

Hong-Kui Yand and Ezz I. El-Masry; Double Sampling Delta-Sigma Modulators; IEEE Transactions on Circuits and Systems—II; Analog and Digital Signal Processing, vol. 43, No. 7, Jul. 1996; pp. 524-529.

Daniel Senderowicz; Germano Nicollini; Sergio Pernici; Angelo Nagari; Pierangelo Confalonieri and Carlo Dallavalle; Low-Voltage Double-Sampled Sigma-Delta Converters; 1997 IEEE; pp. 1907-1919, no month.

Daniel Senderowicz, Germano Nicollini, Sergio Pernici; Angelo Nagari, Pierangelo Confalonieri and Carlo Dallavalle; Low-Voltage Dougle-Sampled Sigma Delta Converters; 1997 IEEE International Solid State Circuits Conference; pp. 210-211 and 458, no month.

Li Yu and Martin Snelgrove; MisMatch Cancellation for Double-Sampling Sigma-Delta Modulators; 1998 IEEE; pp. I-356-I-359, no month.

Seng-Pan U, R.P. Martins and J.E. Franca; High Performance Multirate SC Circuits with Predictive Correlated Double Sampling Technique; 1999 IEEE; pp. II-77-II-80, no month.

Gabriel Gomez and Baher Haroun; A 1.5V 2.4/2.9W 79/50dB DR Sigma Delta Modulator for GSM/WCDMA in a 0.13 Nanometer Digital Process; ISSCC 2002/Session 18/Converter Techniques/18.1; pp. 242-243; 490, no month no year.

Allessandro Dezzani and Eric Andre; A 1.2-V Dual-Mode WCDMA/GPRS Sigma Delta Modulator; ISSCC 2003/Session 3/Oversampled A/D Converters/ Paper 3.3; 8 pgs, no month no year.

Takeshi Ueno and Tetsuro Itakura; A 0.9V 1.5mW Continuous-Time Delta Sigma Modulator for WCDMA; ISSCC 2004/Session 4/Oversampled ADCs/4.4; 10 pgs, no month no year.

Richard Gaggl, Maurizio Inversi and Andreas Wiesbauer; A Power Optimized 14-Bit SC Delta Sigma Modulator for ADSL CO Applications; ISSCC 2004/Session 4/Oversampled ADCs/4.6; 10 pgs, no month no year.

K. Philips, P.A.C. M, Nuijten, R. Roovers. F. Munoz, M. Tejero and A. Torralba; A 2mW 89dB DR Continuous-Time Sigma Delta ADC with Increased Immunity to Wide-Band Interferers; ISSCC 2004/Session 4/Oversampled ADCs/4.8; 10 pgs, no month.

Bas M. Putter; Sigma Delta ADC with Finite Impulse Response Feedback DAC; ISSCC 2004/Session 4/Oversampled ADCs/4.3; 8 pgs, no month.

* cited by examiner

SYSTEMS AND METHODS FOR MISMATCH CANCELLATION IN SWITCHED CAPACITOR CIRCUITS

CROSS REFERENCE TO RELATED APPLICATIONS

The present application claims priority to U.S. Provisional Patent Application No. 60/636,501 entitled "Mismatch Cancellation in Double Sampling Sigma-Delta ADC", and filed Dec. 16, 2004. The entirety of the aforementioned provisional patent application is incorporated herein by reference for all purposes.

BACKGROUND OF THE INVENTION

The present invention is related to switched capacitor circuits. More particularly, the present invention is related to sigma-delta converters.

A number of electronic systems rely upon circuits that convert between the analog and digital domain. For example, cellular telephones typically include both an analog to digital converter and a digital to analog converter. The aforementioned converters are often implemented as sigma-delta modulators because of the favorable trade-off between power consumption, over-sampling rate (OSR), and signal to noise ratio (SNR) offered by sigma-delta modulators.

Existing systems have attempted to increase SNR provided by such sigma-delta modulators by increasing the effective sampling rate of the modulators. The following equation describes the increase in SNR achieved by doubling the effective sampling rate:

$$\Delta(SNR)=3(2n+1) \text{ dB, where n represents the order of a sigma-delta modulator.}$$

Figure 1:
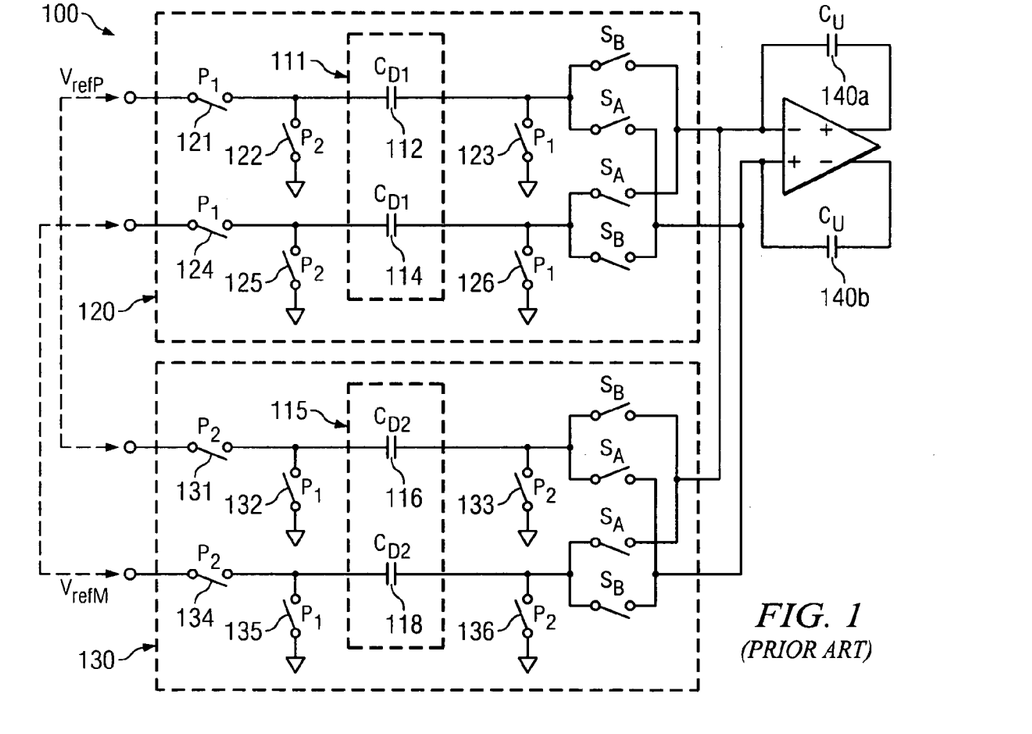
FIG. 1 depicts a prior art double-sampled switched capacitor digital to analog converter.

Thus, for example, by doubling the effective sampling rate the SNR is increased by fifteen dB where the sigma-delta modulator is a second order loop. This increase in effective sampling rate is typically achieved by providing two sampling capacitors operating with interleaved clock signals. An exemplary, conventional double-sampled digital to analog converter (DAC) 100 using two sampling capacitors is depicted in FIG. 1.

DAC 100 includes a first switched capacitor block 120 and a second switched capacitor block 130. Switched capacitor block 120 includes switches 121–126 along with switches $S_A$, $S_B$; and switched capacitor block 130 includes switches 131–136 along with switches $S_A$, $S_B$. As shown, the conventional architecture utilizes two sampling capacitors for each switched capacitor block. Thus, switched capacitor block 120 includes a capacitor bank 111 with sampling capacitors ($C_{D1}$) 112, 114. Similarly, switched capacitor block 130 includes a capacitor bank 115 with sampling capacitors ($C_{D2}$) 116, 118. In operation, switches 121, 123, 124, 126, 132, 135 close during a first phase ($P_1$), and switches 122, 125, 131, 133, 134, 136 close during a second phase ($P_2$). Thus, sampling capacitors 116, 118 of switched capacitor block 130 charge during $P_2$. At the same time, charge is transferred from sampling capacitors 112, 114 to integration capacitors ($C_{tt}$) 140. During the opposite phase, $P_1$, sampling capacitors 116, 118 are charged, and charge is transferred from sampling capacitors 112, 114 to integration capacitors 140. By charging and transferring during two phases, the effective sampling rate of DAC 100 is doubled.

While the SNR is increased due to the increased sampling rate, doubling the effective sampling rate by use of two sampling capacitors operating with interleaved clock signals typically produces a phase-dependent gain error due to a mismatch between sampling capacitors ($C_{D1}$) 112, 114 and sampling capacitors ($C_{D2}$) 116, 118. This phase-dependent gain error is referred to herein as an alternating gain effect that causes quantization noise to fold over into the signal bandwidth. In particular, as described by the following equations, charge transferred to integration capacitors 140 during $P_1$ is different from that transferred during $P_2$:

$$Q_{P2}=(V_{refp}-V_{refm})C_{D1}$$

$$Q_{P1}=(V_{refp}-V_{refm})C_{D2}$$

Thus, where $C_{D1}=C_{D2}+\Delta C$, the charge difference between phases is $(V_{refp}-V_{refm}) \Delta C$. This charge difference results in the alternating gain effect noted above.

One solution for limiting the alternating gain effect is to increase the size of sampling capacitors 112, 114, 116, 118. By doing so, any difference ($\Delta C$) between sampling the first set of sampling capacitors 112, 114 and the second set of sampling capacitors 116, 118 is rendered insignificant. This approach, however, is costly in terms of area and other design considerations.

Another approach for dealing with the alternating gain effect is to use floating capacitor design. An example of such a floating design is set forth in "Low-Voltage Double-Sampled ΣΔ Converters", IEEE Journal of Solid State Circuits, Vol. 32, No. 12, pp. 1907–1919, Dec. 12, 1997. However, in such designs the transfer function is changed from that of a conventional double-sampled sigma-delta circuit. In some cases this change in transfer function is not significant for a second order filter, but becomes increasingly significant for higher order filters.

Hence, for at least the aforementioned reasons, there exists a need in the art for advanced circuits, systems and methods for implementing double-sampled delta sigma modulators.

BRIEF SUMMARY OF THE INVENTION

The present invention is related to switched capacitor circuits. More particularly, the present invention is related to sigma-delta converters.

Various embodiments of the present invention provide double sampling sigma-delta modulator circuits. The circuits include an amplifier with an integrating capacitor, a switched capacitor conversion element that includes a single capacitor bank, and a control element that provides phase signaling that identifies at least two phases. In operation, charge present on the single capacitor bank is transferred to the integrating capacitor and the single capacitor bank is charged during one phase. During the other phase, charge present on the single capacitor bank is transferred to the integrating capacitor, and the single capacitor bank is discharged.

In some instances of the embodiments, the switched capacitor conversion element is a double sampled digital to analog converter. Further, in various intances of the embodiments, the circuit also comprises a p-path delay that provides feedback to the amplifier. This p-path delay may be implemented using two switched capacitor structures. The two switched capacitor structures provide a rotating sampling with one of the switched capacitor structures sampling an output of the amplifier, and the other switched capacitor structure transferring the past sampled output of the amplifier to the integrating capacitor. A q-path delay circuit may also be included. The q-path delay provides feedback to the amplifier and may be implemented using three switched capacitor structures. The three switched capacitor structures provide a rotating sampling with a first of the switched capacitor structures sampling an output of the amplifier, a second of the switched capacitor structures holding the previously sampled output, and a third of the switched capacitor structures transferring the previously held output of the amplifier to the integrating capacitor.

In various instances of the embodiments, the circuit provides a transfer function that is substantially identical to a corresponding circuit using a dual switched capacitor element with two capacitor banks, while at he same time the circuit substantially eliminates alternating gain effect. In one or more instances of the embodiments, the circuit is implemented in a deep sub-micron process. This deep sub-micron process may have a feature size of less than 100 nanometers. In one particular case, the deep sub-micron process is a ninety nanometer digital CMOS process using metal-to-metal capacitors.

Other embodiments of the present invention provide scalable, double sampling sigma-delta modulator circuits. The circuits include an amplifier coupled to a double sampled digital to analog converter. The double sampled digital to analog converter is free of alternating gain effect. In one particular case, the circuit further includes a control element that provides phase signaling which identifies at least a first phase and a second phase. During the first phase, charge present on the single capacitor bank is transferred to an integrating capacitor associated with the amplifier, and a single capacitor bank incorporated in the single switched capacitor structure is charged. In contrast, during the second phase, charge present on the single capacitor bank is transferred to the integrating capacitor, and the single capacitor bank is discharged.

Yet other embodiments of the present invention provide methods for implementing a double sampled sigma-delta converter. The methods include providing an amplifier with an integrating capacitor, providing a double sampled digital to analog converter including only one switched capacitor structure with a single capacitor bank, and providing control element. The control element is operable to identify at least a two phases. The methods further include electrically coupling the control element to the double sampled digital to analog converter, and electrically coupling the double sampled digital to analog converter to the amplifier. In various cases, the methods further include transferring charge from the single capacitor bank to the integrating capacitor, and charging the single capacitor bank on one of the phases; and transferring charge from the single capacitor bank to the integrating capacitor, and discharging the single capacitor bank during the other phase.

This summary provides only a general outline of some embodiments of the present invention. Many other objects, features, advantages and other embodiments of the present invention will become more fully apparent from the following detailed description, the appended claims and the accompanying drawings.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION OF THE INVENTION

The present invention is related to switched capacitor circuits. More particularly, the present invention is related to sigma-delta converters.

Various embodiments of the present invention provide for analog to digital and/or digital to analog conversion using double-sampling techniques. As used herein, the conversion from analog to digital, and from digital to analog are both commonly referred to as conversion. These double-sampling techniques provide for increased OSR, while incurring a reasonable increase in power consumption when compared with conventional single-sampling techniques. In contrast to other conversion circuits that utilize two distinct capacitor banks to achieve double-sampling, embodiments of the present invention utilize a single capacitor bank. Use of a single capacitor bank reduces or eliminates any alternating gain effect typical of conventional double-sampling conversion circuits. In addition, the use of a single capacitor bank can save area and reduce parasitics found in the corresponding dual capacitor bank circuits.

Turning to FIGS. 2, a filter circuit 200 in accordance with various embodiments of the present invention is illustrated. As depicted in FIG. 2A, filter 200 is a second order filter that includes an amplifier 210 with an integrating capacitor ($C_U$) 214 attached between a negative input 211 and a positive output 212. In addition, amplifier 210 includes an integrating capacitor ($C_U$) 218 attached between a negative input 215 and a positive output 216. An input circuit 230 and a double-sampling digital to analog converter 250 drive amplifier 210. In addition, a p-path delay circuit 270 and a q-path delay circuit 280 provide feedback to amplifier 210. A control circuit 290 provides phase signals $P_1$, $P_2$, $P_3$, $P_4$ and $P_5$. These phase signals control the sequence of operation of input circuit 230, double-sampling digital to analog converter 250, p-path delay circuit 270, and q-path delay circuit 280. In particular, phase signals $P_1$ and $P_2$ are used to control the operation of input circuit 230, double-sampling digital to analog converter 250, and p-path delay circuit 270, while phase signals $P_3$, $P_4$ and $P_5$ control q-path delay circuit 280.

Figure 2A:
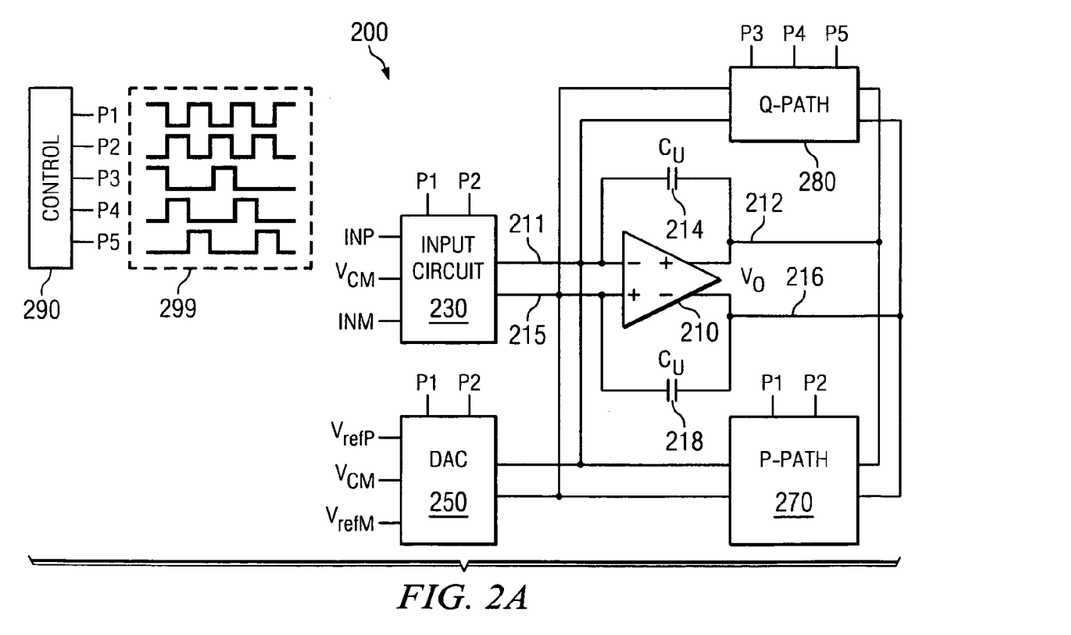
FIG. 2A is a schematic diagram of a filter circuit in accordance with one or more embodiments of the present invention.

A timing diagram 299 is included with FIG. 2A that shows the relationship of phase signals $P_1$, $P_2$, $P_3$, $P_4$, $P_5$ as a function of time. In particular, phases $P_1$ and $P_2$ are complementary. Phases $P_3$, $P_4$ and $P_5$ are sequential with phase $P_3$ asserting for one period while phases $P_4$ and $P_5$ are not asserted; $P_4$ asserts for the period following the assertion of phase $P_3$, and while $P_3$ and $P_5$ are not asserted; and P5 asserts for the period following the assertion of phase $P_4$, and while $P_3$ and $P_4$ are not asserted. The length of phase signals $P_1$, $P_2$, $P_3$, $P_4$, $P_5$ may be a function of the rate at which filter circuit 200 is clocked. Based on the disclosure provided herein, one of ordinary skill in the art will recognize a variety of phase signals, timings, and relationships between phase signals that may be used in accordance with one or more embodiments of the present invention.

In one particular embodiment of the present invention, filter circuit 200 can be used in a sigma-delta ADC to provide a signal transfer function (STF) and a noise transfer function (NTF) as set forth below:

$$STF = z^{-1}/(1 - p^* z^{-1} - q^* z^{-2} + z^{-1} G(z)),$$

where p is defined by the p-path circuit and q is defined by the q-path circuit; and $$NTF = (1 - p^* z^{-1} - q^* z^{-2})/(1 - p^* z^{-1} - q^* z^{-1} + z^{-1} G(z)),$$

where p is defined by the p-path circuit and q is defined by the q-path circuit.

Of note, this is the same STF and NTF achievable where a corresponding circuit using a dual switched capacitor element with two capacitor banks such as that of FIG. 1 is used. Thus, filter circuit 200 provides an alternative to conventional approaches while reducing or eliminating the previously described alternating gain effects. Further, it should be noted that while the described filter is a second order filter, higher order filters may be designed using elements in accordance with the described embodiments of the present invention. Because the STF and NTF are the same as conventional building blocks, building blocks disclosed herein may be readily used for creating higher order filters making the present invention capable of facilitating scalable filter design.

Figure 2B:
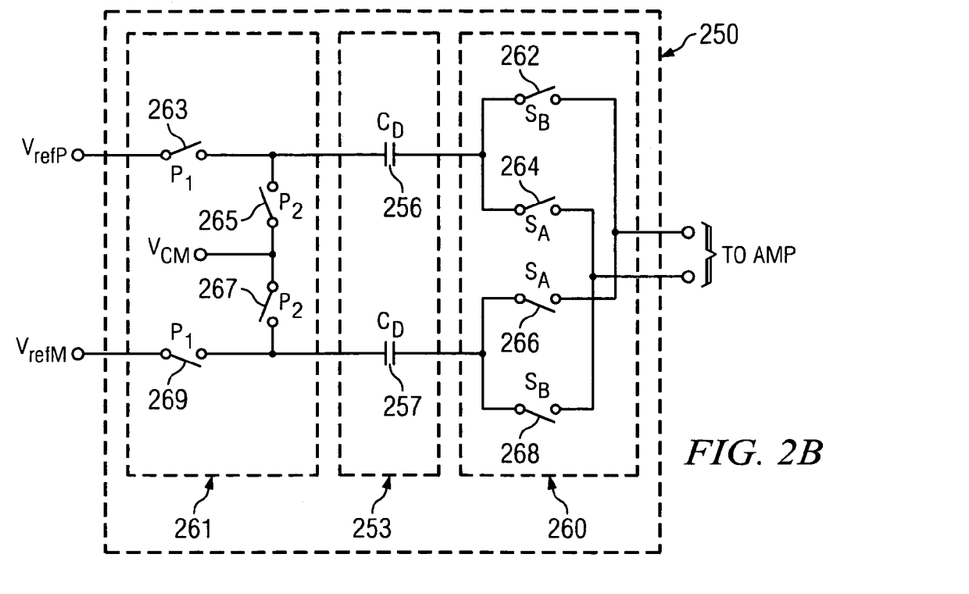
FIG. 2B is a detailed view of the double-sampling digital to analog converter of FIG. 2A.

FIG. 2B provides a detailed view of double-sampling digital to analog converter 250. As depicted, double-sampling digital to analog converter 250 includes a single switched capacitor structure 250 with a single capacitor bank 253 that includes two sampling capacitors ($C_d$) 256, 257. In addition, double-sampling digital to analog converter 250 includes a switch circuit 261 with two switches 263, 269 that are closed during phase $P_1$, and two switches 265, 267 that close during phase $P_2$. Double-sampling digital to analog converter 250 also includes a transfer switch circuit 260 comprised of two switches 262, 268 that are closed whenever $S_B$ is asserted, and two switches 264, 266 that are closed whenever $S_A$ is asserted. Where filter circuit 200 is associated with a sigma-delta ADC, $S_A$ and $S_B$ may be asserted based on an output from a quantizer included with the sigma-delta ADC. A timing based discussion of the various switch positions is provided below as Table 1.

TABLE 1

|  | Quantizer Out = 1 | | Quantizer Out = 0 | |
| --- | --- | --- | --- | --- |
| $P_1$ | Closed | Open | Closed | Open |
| $P_2$ | Open | Closed | Open | Closed |
| $S_A$ | Closed | Open | Open | Closed |
| $S_B$ | Open | Closed | Closed | Open |

It should be noted that filter circuit 200 is designed for differential operation. As such, two sampling capacitors 256, 257 are used with one of the sampling capacitors electrically coupled to the positive reference voltage ($V_{refP}$), and the other electrically coupled to the negative reference voltage ($V_{refM}$). In such a differential situation, a bank of sampling capacitors includes two sampling capacitors. In contrast, where the filter is implemented as a non-differential circuit only a single sampling capacitor electrically to $V_{ref}$ is required. Thus, for the purposes of this document, the term "single capacitor bank" is used in its broadest sense to mean a bank of one or two capacitors depending upon whether the particular circuit design is a differential design or not.

Figure 2C:
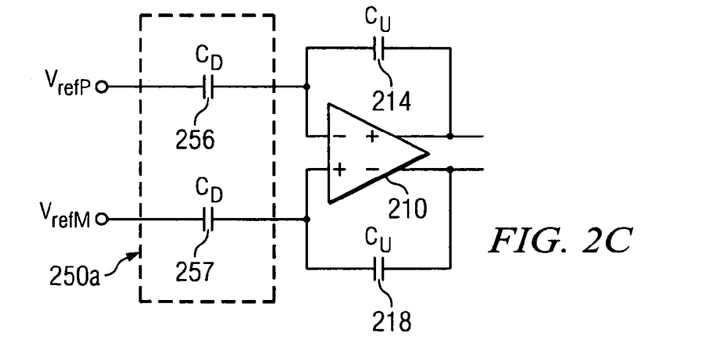
FIGS. 2C–2D show distinct operational states of the double-sampling digital to analog converter of FIG. 2B with switches $S_A$ and $S_B$ omitted for simplicity.

For simplicity the operation of switch circuit 260 is ignored for the proceeding discussion with an understanding that one of ordinary skill in the art would be capable of augmenting the discussion to include operation of switch circuit 260 as set forth in Table 1 above. Thus, for discussion purposes, it is assumed that an electrical path exists from sampling capacitors 256, 257 to amplifier 210. Turning to FIG. 2C, a simplified view of double-sampling digital to analog converter 250a depicts operation during phase $P_1$ where switch 263 and switch 269 are closed, and switch 265 and switch 269 are open. In this configuration, the charge ($Q_u$) on integration capacitors 214, 218 and the charge ($Q_d$) on sampling capacitors 256, 257 are described by the following equations:

$$|Q_u| = C_d(V_{refP} - V_{refM});$$

$$|Q_d| = C_d(V_{refP} - V_{refM})$$

Thus, during phase $P_1$ the charge provided to integration capacitors 214, 218 is equal to that stored by sampling capacitors 256, 257. This charge provided to integration capacitors 214, 218 is used during the next integration phase of filter circuit 200.

Figure 2D:
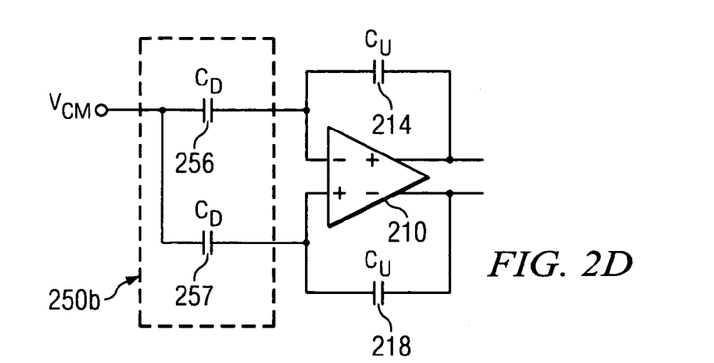

In contrast, FIG. 2D is a simplified view of double-sampling digital to analog converter 250b depicting operation during phase $P_2$ where switch 265 and switch 267 are closed, and switch 263 and switch 269 are open. In this configuration, the charge ($Q_u$) on integration capacitors 214, 218 and the charge ($Q_d$) on sampling capacitors 256, 257 are described by the following equations:

$$|Q_u| = C_d(V_{refP} - V_{refM});$$

$$|Q_d| = 0$$

Thus, the single capacitor bank transfers charge to integration capacitors during both phases, $P_1$ and $P_2$. During $P_1$, charge is transferred to integrating capacitors 214, 218, while the sampling capacitors ($C_d$) are also charged. During the opposite phase, $P_2$, the sampling capacitors are discharged by transferring charge to integrating capacitors 214, 218. Again, transfer of charge through switches $S_A$ or $S_B$ into the positive or negative virtual ground of the op-amp depends upon the clock phase and a control word that is fed back from the quantizer output.

Figure 2E:
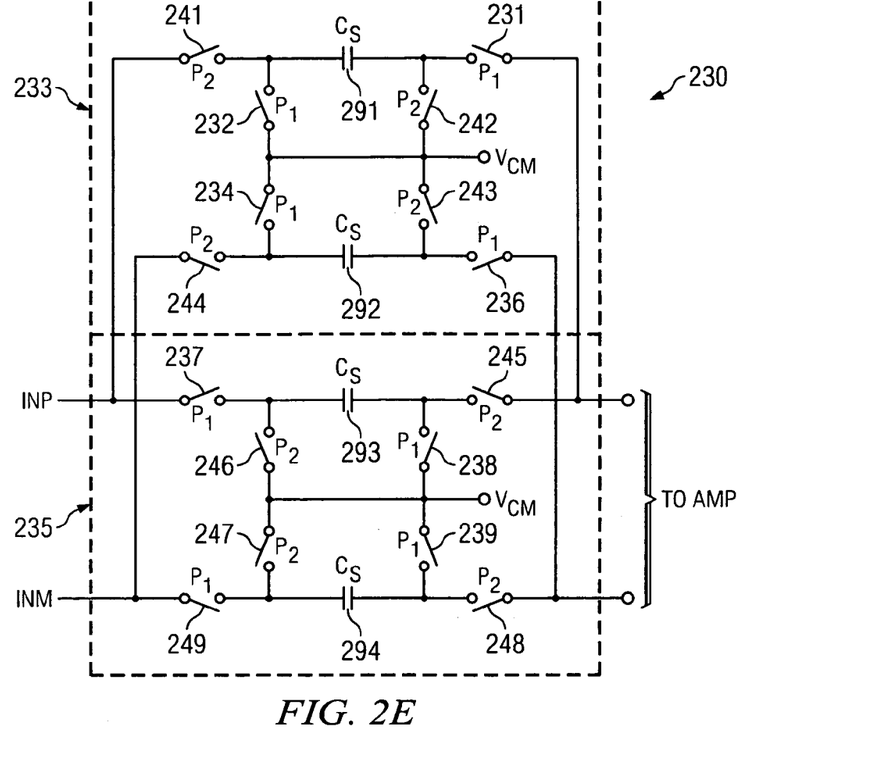
FIG. 2E is a detailed view of the input circuit of FIG. 2A.

Turning to FIG. 2E, two equal fully differential input structures 233, 235 are shown that operate on complementary clock phases $P_1$ and $P_2$. Using complementary clock phases effectively doubles the OSR. In particular, switches 231, 232, 234, 236, 237, 238, 239 and 249 close during phase $P_1$, and switches 241, 242, 243, 244, 245, 246, 247 and 248 close during phase $P_2$. Thus, during phase $P_1$, input capacitors ($C_s$) 293, 294 are charged and charge stored on input capacitors ($C_s$) 291, 292 is transferred to respective integration capacitors 214, 218. During phase $P_2$, charge previously stored on input capacitors 293, 294 is transferred to respective integration capacitors 214, 218 and input capacitors 291, 292 are charged.

Figure 2F:
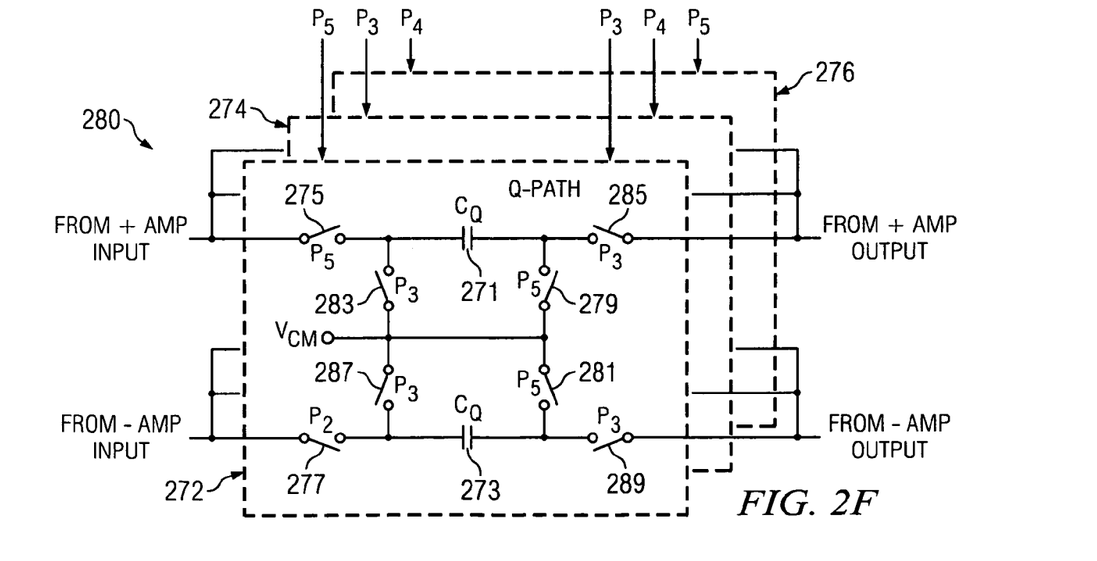
FIG. 2F is a detailed view of the q-path delay circuit of FIG. 2A.

In addition, as depicted in FIG. 2F, three switched capacitor structures 272, 274, 276 controlled by phase signals $P_3$, $P_4$, $P_5$ realize the delay in q-path delay circuit 280. Detail of switched capacitor structure 272 is provided that shows q-capacitors ($C_{q1}$) 271, 273, switches 283, 285, 287, 289 that close during phase $P_3$, and switches 275, 277, 279, 281 that close during phase $P_5$. A corresponding structure exists for switched capacitor structures 274 and 276. In particular, switched capacitor structure 274 includes switches (not shown) that correspond to switches 275, 277, 279, 281 but close during phase $P_3$, and switches (not shown) that correspond to switches 283, 285, 287, 289 but close during phase $P_4$. In addition, switched capacitor structure 274 includes q-capacitors ($C_{q2}$) (not shown) corresponding to q-capacitors 271, 273. Similarly, switched capacitor structure 276 includes switches (not shown) that correspond to switches 275, 277, 279, 281 but close during phase $P_4$, and switches (not shown) that correspond to switches 283, 285, 287, 289 but close during phase $P_5$. Switched capacitor structure 276 also includes q-capacitors ($C_{q3}$) (not shown) corresponding to q-capacitors 271, 273.

In operation, switched capacitor structures 272, 274, 276 are connected such that they provide a progressive, rotational sampling of amplifier 210 output. In particular, while one of the switched capacitor structures samples the ouput of amplifier 210 ($V_o(n+2)$), another of the switched capacitor structures holds the previous output of amplifier 210 ($V_o(n+1)$), and the third switched capacitor structure transfers an earlier sample of the output of amplifier 210 ($V_o(n)$) to integration capacitors 214, 218. Yet more particularly, during phase $P_3$, q-capacitors $C_{q1}$ are charged with the output of amplifier 210 ($V_o(n+2)$). At the same time, the charge stored on q-capacitors $C_{q2}$, $C_{q2}*V_o(n)$, is transferred to respective integration capacitors 214, 218. During phase $P_4$, q-capacitors $C_{q2}$ are charged with the output of amplifier 210 ($V_o(n+3)$). At the same time, the charge stored on q-capacitors $C_{q3}$, $C_{q3}*V_o(n+1)$, is transferred to respective integration capacitors 214, 218. During phase $P_5$, q-capacitors $C_{q3}$ are charged with the output of amplifier 210 ($V_o(n+4)$). At the same time, the charge stored on q-capacitors $C_{q1}$, $C_{q1}*V_o(n+2)$, is transferred to respective integration capacitors 214, 218.

Figure 2G:
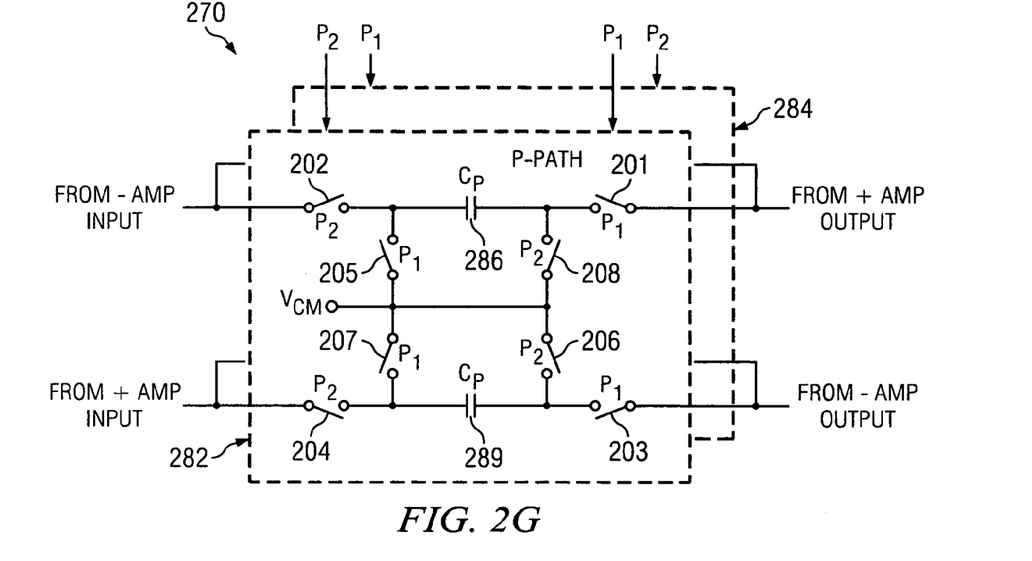
FIG. 2G is a detailed view of the p-path delay circuit of FIG. 2A.

As depicted in FIG. 2G, two switched capacitor structures 282, 284, controlled by phase signals $P_1$, $P_2$ realize the delay in p-path delay circuit 270. Detail of switched capacitor structure 282 is provided that shows p-capacitors ($C_{p1}$) 286, 289, switches 201, 203, 205, 207 that close during phase $P_1$, and switches 202, 204, 206, 208 that close during phase $P_2$. A corresponding structure exists for switched capacitor structure 284. In particular, switched capacitor structure 284 includes switches (not shown) that correspond to 201, 203, 205, 207 but close during phase $P_2$, and switches (not shown) that correspond to 202, 204, 206, 208 but close during phase $P_1$. In addition, switched capacitor structure 284 includes p-capacitors ($C_{p2}$) (not shown) corresponding to p-capacitors 286, 289.

In operation, switched capacitor structures 282, 284 are connected such that they provide a progressive, rotational sampling of amplifier 210 output. In particular, while one of the switched capacitor structures samples the ouput of amplifier 210 ($V_o(n+1)$), the other switched capacitor structure an earlier sample of the output of amplifier 210 ($V_o(n)$) to integration capacitors 214, 218. Yet more particularly, during phase $P_1$ p-capacitors $C_{p2}$ are charged with the output of amplifier 210 ($V_o(n+1)$). At the same time, the charge stored on p-capacitors $C_{p2}$, $C_{p2}*V_o(n)$, is transferred to respective integration capacitors 214, 218. During phase $P_2$, p-capacitors $C_{p1}$ are charged with the output of amplifier 210 ($V_o(n+2)$). At the same time, the charge stored on p-capacitors $C_{p2}$, $C_{p2}*V_o(n+1)$, is transferred to respective integration capacitors 214, 218.

Behavioral analysis and simulations performed on an exemplary embodiment of the present invention using an op-amp gain of fifty dB, a bandwidth of greater than fifty MHz, and a slew rate of greater than one hundred volts/microsecond. These specifications may be obtained in a ninety nanometer digital CMOS process under low voltage conditions using a two stage class-A amplifier. In the amplifier, the first stage provides enough gain and the second stage affords a good dynamic range. In wide band CDMA (WCDMA), amplifier input referred noise is not the main limiting factor, but rather quantization on noise dominates the SNR. Thus, in applying embodiments of the present invention to WCDMA applications, it may be desirable to design transistor sizes and current biases to satisfy defined minimum bandwidth and slew rate requirements, while at the same time optimizing power consumption and area.

In one particular embodiment, a 38.4 MHz clock signal is used. Because of the employed double-sampling technique, a sampling frequency of 76.8 MHz is achieved. In the design, the quantizer is implemented using a five level switched capacitor flash analog to digital converter with four clocked comaparators. The comparators are formed by a differential pre-amplifier followed by a clocked latch. In the particular design, each of the comparators draws a current of about twenty microamperes. Capacitor mismatch in the five level digital to analog converter my be corrected, for example, by using an individual level averaging technique disclosed in "A/D Converter Incorporating a Novel Class of Dynamic Element Matching Techniques," IEEE Trans. on Circuits and Systems II, vol. 39, No. 1, pp. 39–51, January 1992. The entirety of the aforementioned article is incorporated herein by reference for all purposes.

Figure 3:
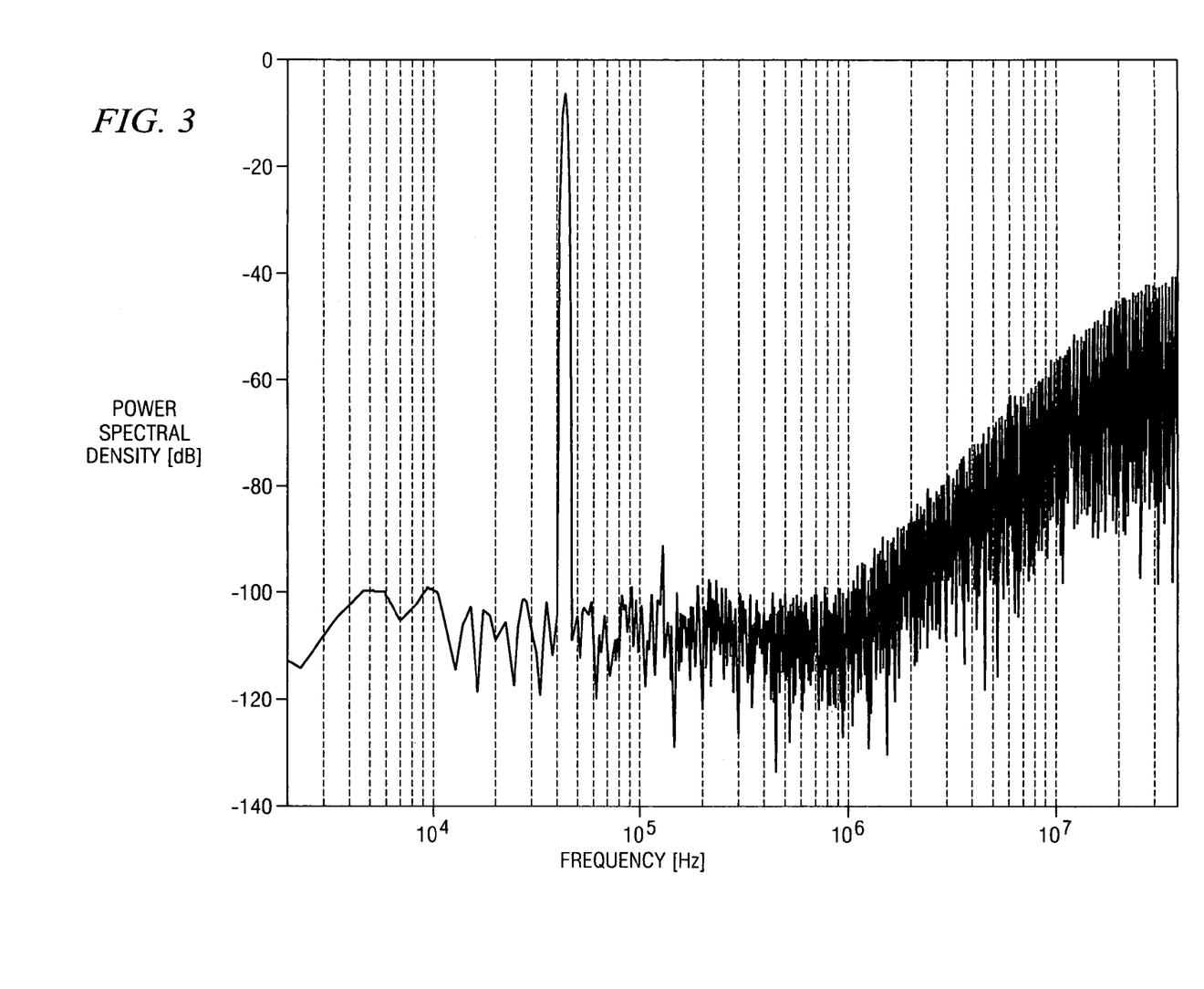
FIG. 3 shows a measured FFT plot for a particular embodiment of the present invention using a sampling frequency of 76.8 MHz, and excited with a −6 dBFS fully differential sinusoidal signal at five hundred kHz.
Figure 4:
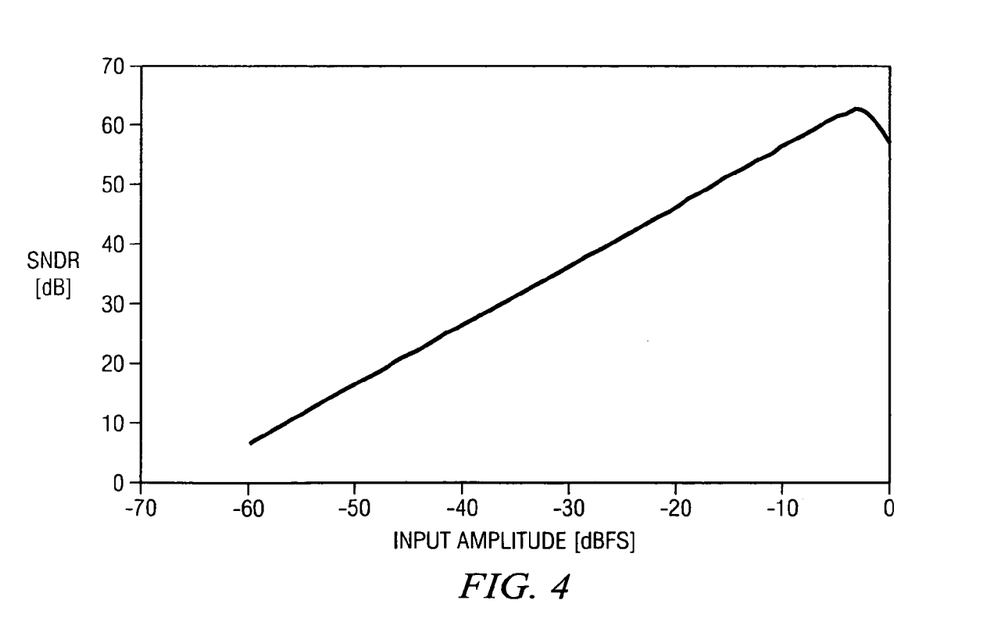
FIG. 4 is a shows the measured SNDR verses input amplitude for the particular embodiment represented by FIG. 3.

Various simulations and measurements were performed on the previously described circuit and a graphical depiction of the results are provided as FIG. 3 and FIG. 4. In particular, FIG. 3 shows a measured FFT plot for a −6 dBFS fully differential sinusoidal signal at five hundred kHz using a sampling frequency of 76.8 MHz. FIG. 4 shows the measured SNDR verses input amplitude. The graph of FIG. 4 was prepared by measuring circuit performance when a 468 KHz sinusoidal input signal is applied in one dB steps from −60 dBFS to 0 dBFS. The measured peak of SNDR is 63 dB when the input is −3 dBFS. Based on the disclosure provided herein, one of ordinary skill in the art will appreciate that a variety of design requirements and results may be achieved in accordance with embodiments of the present invention and based on various optimazations.

The invention has now been described in detail for purposes of clarity and understanding. However, it will be appreciated that certain changes and modifications may be practiced within the scope of the appended claims. Thus, although the invention is described with reference to specific embodiments and figures thereof, the embodiments and figures are merely illustrative, and not limiting of the invention. Rather, the scope of the invention is to be determined solely by the appended claims.

What is claimed is:

1. A double-sampling sigma-delta modulator circuit, the circuit comprising:
    an amplifier including an integrating capacitor;
    a switched capacitor conversion element including a single capacitor bank, wherein the single capacitor bank includes a first capacitive element and a second capacitive element; and
    a control element, wherein the control element provides phase signaling that identifies at least a first phase and a second phase;
    wherein during the first phase charge present on the single capacitor bank is transferred to the integrating capacitor, and the single capacitor bank is charged; and
    wherein during the second phase charge present on the single capacitor bank is transferred to the integrating capacitor, and the single capacitor bank is discharged by electrically coupling a first plate of the first capacitive element to a first plate of the second capacitive element and electrically coupling a second plate of the first capacitive element and a second plate of the second capacitive element to the integrating capacitor.

2. The circuit of claim 1, wherein the switched capacitor conversion element is a double-sampled digital to analog converter.

3. The circuit of claim 1, wherein the circuit further comprises a p-path delay, wherein the p-path delay provides feedback to the amplifier, and wherein the p-path delay is implemented using two switched capacitor structures.

4. The circuit of claim 3, wherein the two switched capacitor structures provide a rotating sampling with one of the switched capacitor structures sampling an output of the amplifier, and the other switched capacitor structure transferring the past sampled output of the amplifier to the integrating capacitor.

5. The circuit of claim 1, wherein the circuit further comprises a q-path delay, wherein the q-path delay provides feedback to the amplifier, and wherein the q-path delay is implemented using three switched capacitor structures.

6. The circuit of claim 5, wherein the three switched capacitor structures provide a rotating sampling with a first of the switched capacitor structures sampling an output of the amplifier, a second of the switched capacitor structures holding the previously sampled output, and a third of the switched capacitor structures transferring the previously held output of the amplifier to the integrating capacitor.

7. The circuit of claim 1, wherein the circuit provides a transfer function substantially identical to a corresponding circuit using a dual switched capacitor element with two capacitor banks.

8. The circuit of claim 1, wherein the circuit is implemented in a deep sub-micron process.

9. The circuit of claim 8, wherein the deep sub-micron process has a feature size of less than 100 nanometers.

10. The circuit of claim 8, wherein the deep sub-micron process is a ninety nanometer digital CMOS process using metal-to-metal capacitors.

11. The circuit of claim 1, wherein the circuit substantially eliminates alternating gain effect.

12. A scalable, double-sampling sigma-delta modulator circuit, the circuit comprising:
    an amplifier, wherein the amplifier includes an integrating capacitor;
    a double-sampled digital to analog converter operable in a first phase and a second phase, wherein the double sampled digital to analog converter includes a sampling capacitor bank with a first capacitor and a second capacitor, and wherein the double-sampled digital to analog converter is coupled to the amplifier;
    wherein during the first phase charge present on the sampling capacitor bank is transferred to the integrating capacitor, and the sampling capacitor bank is charged; and
    wherein during the second phase charge present on the sampling capacitor bank is transferred to the integrating capacitor, and the sampling capacitor bank is discharged by electrically coupling a first plate of the first capacitor to a first plate of the second capacitor and electrically coupling a second plate of the first capacitor and a second plate of the second capacitor to the amplifier.

13. The circuit of claim 12, wherein the amplifier includes an integrating capacitor, wherein the double-sampled digital to analog converter includes a single switched capacitor structure with a single capacitor bank, and wherein the circuit further comprises:
    a control element, wherein the control element provides phase signaling that identifies at least a first phase and a second phase
    wherein during the second phase charge present on the single capacitor bank is transferred to the integrating capacitor, and the single capacitor bank is discharged.

14. The circuit of claim 12, wherein the circuit further comprises a p-path delay, wherein the p-path delay provides feedback to the amplifier, wherein the p-path delay is implemented using two switched capacitor structures, and wherein the two switched capacitor structures provide a rotating sampling with one of the switched capacitor structures sampling an output of the amplifier, and the other switched capacitor structure transferring the past sampled output of the amplifier to the integrating capacitor.

15. The circuit of claim 12, wherein the circuit further comprises a q-path delay, wherein the q-path delay provides feedback to the amplifier, wherein the q-path delay is implemented using three switched capacitor structures, and wherein the three switched capacitor structures provide a rotating sampling with a first of the switched capacitor structures sampling an output of the amplifier, a second of the switched capacitor structures holding the previously sampled output, and a third of the switched capacitor structures transferring the previously held output of the amplifier to the integrating capacitor.

16. The circuit of claim 12, wherein the circuit is implemented in a deep sub-micron process.

17. The circuit of claim 16, wherein the deep sub-micron process is a ninety nanometer digital CMOS process using metal-to-metal capacitors.

18. A double-sampling sigma-delta modulator circuit, the circuit comprising:
    an amplifier including an integrating capacitor circuit;
    a switched capacitor conversion element operable in a first phase and a second phase and including a single capacitor bank, wherein the switched capacitor conversion element is coupled to the amplifier; and
    at least one delay circuit selected from a group consisting of: a q-path delay circuit, wherein the q-path delay circuit provides feedback to the amplifier, wherein the q-path delay circuit is implemented using three switched capacitor structures; and a p-path delay circuit, wherein the p-path delay circuit provides feedback to the amplifier, and wherein the p-path delay circuit is implemented using two switched capacitor structures;

wherein during the first phase charge present on the single capacitor bank is transferred to the integrating capacitor circuit, and the single capacitor bank is charged; and wherein during the second phase charge present on the single capacitor bank is transferred to the integrating capacitor circuit, and the single capacitor bank is discharged.

19. The circuit of claim 18, wherein the three switched capacitor structures of the q-path delay circuit provide a rotating sampling with a first of the switched capacitor structures sampling an output of the amplifier, a second of the switched capacitor structures holding the previously sampled output, and a third of the switched capacitor structures transferring the previously held output of the amplifier to the integrating capacitor.

20. The circuit of claim 18, wherein the two switched capacitor structures of the p-path delay circuit provide a rotating sampling with one of the switched capacitor structures sampling an output of the amplifier, and the other switched capacitor structure transferring the past sampled output of the amplifier to the integrating capacitor.

* * * * *